United States Patent
Lim

(10) Patent No.: US 8,289,769 B2
(45) Date of Patent: Oct. 16, 2012

(54) METHOD OF PROGRAMMING NONVOLATILE MEMORY DEVICE

(75) Inventor: Sang Oh Lim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 211 days.

(21) Appl. No.: 12/826,402

(22) Filed: Jun. 29, 2010

(65) Prior Publication Data

US 2010/0329032 A1 Dec. 30, 2010

(30) Foreign Application Priority Data

Jun. 29, 2009 (KR) .................. 10-2009-0058482

(51) Int. Cl.
*G11C 11/34* (2006.01)

(52) U.S. Cl. ......... 365/185.03; 365/185.12; 365/185.18; 365/185.22; 365/185.24; 365/185.25

(58) Field of Classification Search ............. 365/185.03, 365/185.12, 185.18, 185.22, 185.24, 185.25
See application file for complete search history.

(56) References Cited

U.S. PATENT DOCUMENTS

| | | | | |
|---|---|---|---|---|
| 7,120,051 B2 * | 10/2006 | Gorobets et al. | ......... | 365/185.03 |
| 7,180,787 B2 * | 2/2007 | Hosono et al. | ........... | 365/185.18 |
| 7,301,805 B2 * | 11/2007 | Gorobets et al. | ......... | 365/185.03 |
| 7,508,705 B2 * | 3/2009 | Chae et al. | ................ | 365/185.03 |
| 7,609,548 B2 * | 10/2009 | Park | ........................ | 365/185.03 |
| 7,876,618 B2 * | 1/2011 | Lee et al. | ................. | 365/185.18 |
| 8,027,194 B2 * | 9/2011 | Lee et al. | ................. | 365/185.03 |

FOREIGN PATENT DOCUMENTS

KR 1020090037571 A 4/2009

* cited by examiner

*Primary Examiner* — Trong Phan
(74) *Attorney, Agent, or Firm* — William Park & Associates Ltd.

(57) ABSTRACT

A nonvolatile memory device has memory cells coupled to bit lines and word lines and page buffers each coupled to one or more of the bit lines. Program and verification operations are performed on a first logical page from among first and second logical pages included in memory cells selected for a program operation. Data are loaded which will be programmed into the second logical page into first to third latches of a selected page buffer, coupled to the selected memory cells, from among the page buffers. A data setting operation is performed. The second logical page is programmed so that a distribution of threshold voltages of the selected memory cells has one of first to fourth threshold voltage distributions according to states of the data of the first to third latches and performing verification operations for the first to fourth threshold voltage distributions.

23 Claims, 9 Drawing Sheets

METHOD OF PROGRAMMING NONVOLATILE MEMORY DEVICE

CROSS-REFERENCE TO RELATED APPLICATION

This application claims priority to Korean patent application number 10-2009-0058482 filed on Jun. 29, 2009, which is incorporated herein by reference in its entirety.

BACKGROUND

Exemplary embodiments relate to a method of programming a nonvolatile memory device.

A nonvolatile memory device has advantages of random access memory (RAM) (e.g., enabling the writing and erasure of data) and read only memory (ROM) (e.g., retaining data even without the supply of power) and is widely used in storage media for portable electronic devices, such as digital cameras, personal digital assistants (PDAs), and MP3 players.

One memory cell of the nonvolatile memory device, unlike a typical memory device, can store data of multiple states of 2 bits or more. That is, data of several states can be stored by controlling the charge in the floating gate of the memory cell so that the threshold voltage has a different amount. The multi-level cell (hereinafter referred to as an 'MLC') program method is widely used because it can significantly increase the capacity of a nonvolatile memory cell. In the MLC program method, data of two or more logical pages is programmed in one physical page. However, if data of several logical pages is programmed in one physical page, the time that it takes to perform the program operation is long and complicated, and the number of distributions of the threshold voltage is increased. Accordingly, the width of a distribution of the threshold voltage is narrowed and a read margin is reduced, leading to a difficulty in reading data.

BRIEF SUMMARY

Exemplary embodiments relate to a method of programming a nonvolatile memory device, which is capable of narrowing the width of a distribution of the threshold voltage and increasing a read margin of data by performing a double verification method on several distributions of the threshold voltage without greatly increasing the number of latches of a page buffer, in the case in which a multi-level cell (MLC) is programmed and verified.

A method of programming a nonvolatile memory device comprising memory cells, coupled to bit lines and word lines, and page buffers each coupled to one or more of the bit lines according to an aspect of the present disclosure comprises a step of performing program and verification operations on a first logical page from among first and second logical pages included in memory cells selected for a program operation; a data setting step of, after the program operation is performed on the first logical page, loading data for the program operation for the second logical page into first to third latches of a selected page buffer, coupled to the selected memory cells, from among the page buffers, changing states of the data, stored in the second and third latches, according to a program state of the selected memory cells, changing a state of the data stored in the second latch according to the program state of the selected memory cells and the data state of the first latch, resetting the first latch, and storing a result of the program operation for the first logical page in the first latch; and a step of, in performing program and verification steps so that distributions of threshold voltages of the selected memory cells shift to first to fourth threshold voltage distributions according to the data states of the first to third latches, performing verification operations using two verification voltages for each of the second and third distributions.

Loading data for the program operation for the second logical page into first to third latches of a selected page buffer, coupled to the selected memory cells, from among the page buffers, comprises loading the data which will be programmed into the second logical page into the first latch and transferring the data of the first latch to the second and third latches.

Memory cells having the first threshold voltage distribution are in an erase state. Verification operations using first and second verification voltages are performed to verify memory cells which will be programmed to have the second threshold voltage distribution. Verification operations using third and fourth verification voltages are performed to verify memory cells which will be programmed to have the third threshold voltage distribution. A verification operation using a fifth verification voltage is performed to verify memory cells which will be programmed to have the fourth threshold voltage distribution. The threshold voltages of the memory cells having the second threshold voltage distribution are higher than the first threshold voltage distribution. The threshold voltages of the memory cells having the third threshold voltage distribution are higher than the second threshold voltage distribution. The threshold voltages of the memory cells having the fourth threshold voltage distribution are higher than the third threshold voltage distribution.

Changing states of the data, stored in the second and third latches, according to a program state of the selected memory cells and changing a state of the data stored in the second latch according to the program state of the selected memory cells and the data state of the first latch, in the data setting step comprises precharging a sense node of the selected page buffer; changing a voltage level of the sense node according to the program state of the selected memory cells; changing the data states of the second and third latches according to the voltage level of the sense node; precharging the sense node; changing a voltage level of the sense node according to the data state of the first latch; and changing the data state of the second latch according to the voltage level of the sense node.

The method further comprises, after performing the data setting step, checking whether there are memory cells programmed to have the third threshold voltage distribution, from among the memory cells, and changing the data state of the second latch according to a result of the check.

Checking whether there are memory cells programmed to have the third threshold voltage distribution, from among the memory cells, comprises precharging the sense node and changing a voltage level of the sense node by performing a data read operation using the third verification voltage; changing the data state of the second latch according to the voltage level of the sense node; precharging the sense node and changing a voltage level of the sense node by performing a data read operation using the fourth verification voltage; and changing the data state of the second latch according to the voltage level of the sense node.

In the program and verification steps, verifying the memory cells which will be programmed to have the second threshold voltage distribution comprises a step of performing a program operation on the memory cells according to the data states of the first to third latches; a first verification step of changing a voltage level of the sense node by performing a read operation using the first verification voltage, changing the voltage level of the sense node according to the data state of the first latch, and then changing the data state of the third latch according to the voltage level of the sense node; a second verification step of changing a voltage level of the sense node by performing a read operation using the second verification voltage, changing the voltage level of the sense node according to the data state of the first latch, and then changing the data state of the second latch according to the voltage level of the sense node; and a step of determining whether the first and second verification operations have been a pass based on a first verification signal generated according to the data states of the first and second latches.

If, as a result of the determination, the first and second verification operations are determined to be a pass, the first and second verification operations are blinded.

In the program and verification steps, verifying the memory cells which will be programmed to have the third threshold voltage distribution comprises a third verification step of changing a voltage level of the sense node by performing a read operation using the third verification voltage, changing the voltage level of the sense node according to the data state of the second latch, and then changing the data state of the third latch according to the voltage level of the sense node and a fourth verification step of changing a voltage level of the sense node by performing a read operation using the fourth verification voltage and then changing the data state of the second latch according to the voltage level of the sense node.

In the program and verification steps, verifying the memory cells which will be programmed to have the fourth threshold voltage distribution comprises a fifth verification step of changing a voltage level of the sense node by performing a read operation using the fifth verification voltage and then changing the data state of the second latch according to the voltage level of the sense node and a step of determining whether the third to fifth verification operations have been a pass based on a second verification signal generated according to the data states of the second and third latches.

The method further comprises, if, as a result of the determinations, the first to fifth verification operations are determined not to be a pass, raising a program voltage, performing the program operation using the raised program voltage, and performing the first to fifth verification operations.

A method of programming a nonvolatile memory device comprising memory cells, coupled to bit lines and word lines, and page buffers each coupled to one or more of the bit lines according to another aspect of this disclosure comprises performing program and verification operations on a first logical page from among first and second logical pages included in memory cells selected for a program operation; loading data which will be programmed into the second logical page into first to third latches of a selected page buffer, coupled to the selected memory cells, from among the page buffers, and performing a data setting operation; and programming the second logical page so that a distribution of threshold voltages of the selected memory cells has one of first to fourth threshold voltage distributions according to states of the data of the first to third latches and performing verification operations for the first to fourth threshold voltage distributions. Each of the verification operations for the second and third threshold voltage distributions is performed using two verification voltages.

Performing each of the verification operations for the second and third threshold voltage distributions using two verification voltages comprises a data loading step of, after the program operation is performed on the first logical page, loading data for the program operation on the second logical page into the first to third latches of the selected page buffer; a data change step of changing the data states of the second and third latches according to a program state of the selected memory cells and changing the data state of the second latch according to the program state of the selected memory cells and the data state of the first latch; and a data setting step of resetting the first latch and then storing a result of the program operation on the first logical page in the first latch.

The data loading step comprises loading the data which will be programmed into the second logical page into the first latch and transferring the data of the first latch to the second and third latches.

Memory cells having the first threshold voltage distribution are in an erase state. Verification operations using first and second verification voltages are performed to verify memory cells which will be programmed to have the second threshold voltage distribution. Verification operations using third and fourth verification voltages are performed to verify memory cells which will be programmed to have the third threshold voltage distribution. A verification operation using a fifth verification voltage is performed to verify memory cells which will be programmed to have the fourth threshold voltage distribution. The threshold voltages of the memory cells having the second threshold voltage distribution are higher than the first threshold voltage distribution. The threshold voltages of the memory cells having the third threshold voltage distribution are higher than the second threshold voltage distribution. The threshold voltage of the memory cells having the fourth threshold voltage distribution is higher than the third threshold voltage distribution.

The data change step comprises precharging a sense node of the selected page buffer; changing a voltage level of the sense node according to the program state of the selected memory cells; changing the data states of the second and third latches according to the voltage level of the sense node; precharging the sense node; changing a voltage level of the sense node according to the data state of the first latch; and changing the data state of the second latch according to the voltage level of the sense node.

The method further comprises, after performing the data setting step, checking whether there are memory cells programmed to have the third threshold voltage distribution, from among the memory cells, and changing the data state of the second latch according to a result of the check.

Checking whether there are memory cells programmed to have the third threshold voltage distribution, from among the memory cells, comprises precharging the sense node and changing a voltage level of the sense node by performing a data read operation using the third verification voltage; changing the data state of the second latch according to the voltage level of the sense node; precharging the sense node and changing a voltage level of the sense node by performing a data read operation using the fourth verification voltage; and changing the data state of the second latch according to the voltage level of the sense node.

In the program and verification steps, verifying the memory cells which will be programmed to have the second threshold voltage distribution comprises a step of performing a program operation on the memory cells according to the data states of the first to third latches; a first verification step of changing a voltage level of the sense node by performing a read operation using the first verification voltage, changing the voltage level of the sense node according to the data state of the first latch, and then changing the data state of the third latch according to the voltage level of the sense node; a second verification step of changing a voltage level of the sense node by performing a read operation using the second verification voltage, changing the voltage level of the sense node according to the data state of the first latch, and then changing the data state of the second latch according to the voltage level of the sense node; and a step of determining whether the first and second verification operations have been a pass based on a first verification signal generated according to the data states of the first and second latches.

If, as a result of the determination, the first and second verification operations are determined to be a pass, the first and second verification operations are blinded.

In the program and verification steps, verifying the memory cells which will be programmed to have the third threshold voltage distribution comprises a third verification step of changing a voltage level of the sense node by performing a read operation using the third verification voltage, changing the voltage level of the sense node according to the data state of the second latch, and then changing the data state of the third latch according to the voltage level of the sense node and a fourth verification step of changing a voltage level of the sense node by performing a read operation using the fourth verification voltage and then changing the data state of the second latch according to the voltage level of the sense node.

In the program and verification steps, verifying the memory cells which will be programmed to have the fourth threshold voltage distribution comprises a fifth verification step of changing a voltage level of the sense node by performing a read operation using the fifth verification voltage and then changing the data state of the second latch according to the voltage level of the sense node and a step of determining whether the third to fifth verification operations have been a pass based on a second verification signal generated according to the data states of the second and third latches.

The method further comprises, if, as a result of the determinations, the first to fifth verification operations are determined not to be a pass, raising a program voltage, performing the program operation using the raised program voltage, and performing the first to fifth verification operations.

DESCRIPTION OF EMBODIMENTS

Hereinafter, some exemplary embodiments of the present disclosure will be described in detail with reference to accompanying drawings. The figures are provided to allow those having ordinary skill in the art to understand the scope of the embodiments of the disclosure.

Figure 1A:
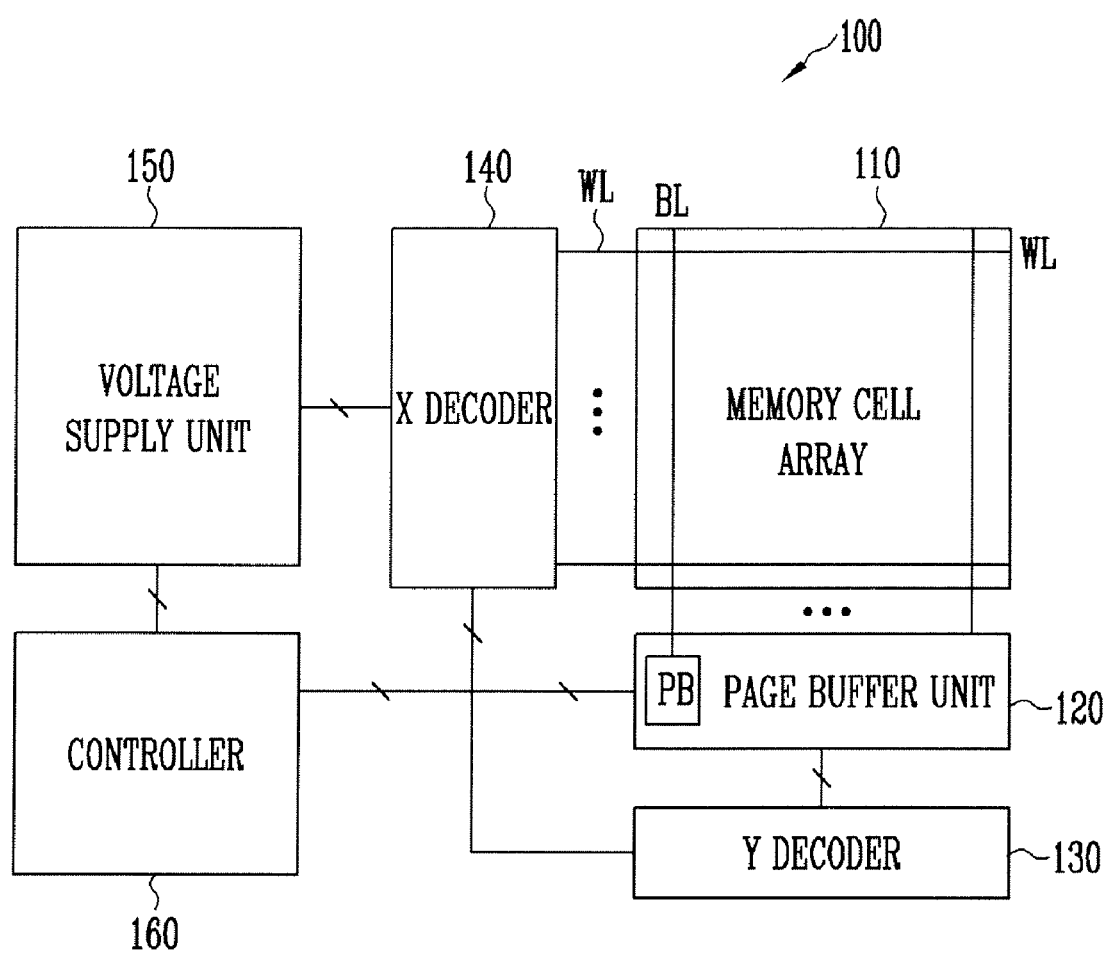
FIG. 1A is a block diagram of a nonvolatile memory device.

Referring to FIG. 1A, an example block diagram of a nonvolatile memory device 100 is depicted. The nonvolatile memory device 100 includes a memory cell array 110, a page buffer unit 120, a Y decoder 130, an X decoder 140, a voltage supply unit 150, and a controller 160.

The memory cell array 110 includes a plurality of memory cells coupled by bit lines BL and word lines WL. In one embodiment, the memory cells of the nonvolatile memory device 100 are MLCs capable of storing data of 2 bits.

Logical pages, including a least significant bit (hereinafter referred to as a 'LSB') page and a most significant bit (hereinafter referred to as an 'MSB') page, are included in each word line corresponding to a physical page.

The page buffer unit 120 includes page buffers PB each coupled to one or more of the bit lines BL. The page buffers PB are used for program and the data read operations. In one embodiment, one page buffer PB is coupled to a pair of the bit lines including an even bit line BLe and an odd bit line BLo.

The Y decoder 130 provides the data I/O path of the page buffers PB in response to control signal of the controller 160.

The X decoder 140 selects one of the word lines and couples the selected word line to global lines for providing voltage for an operation in response to control signal of the controller 160.

The voltage supply unit 150 generates voltages for a program, verification, data read, or erase operation and supplies the voltages to global lines.

The controller 160 outputs the control signal for the program, verification, data read, and erase operations.

The construction of the page buffer PB according to one embodiment of this disclosure is described below.

Figure 1B:
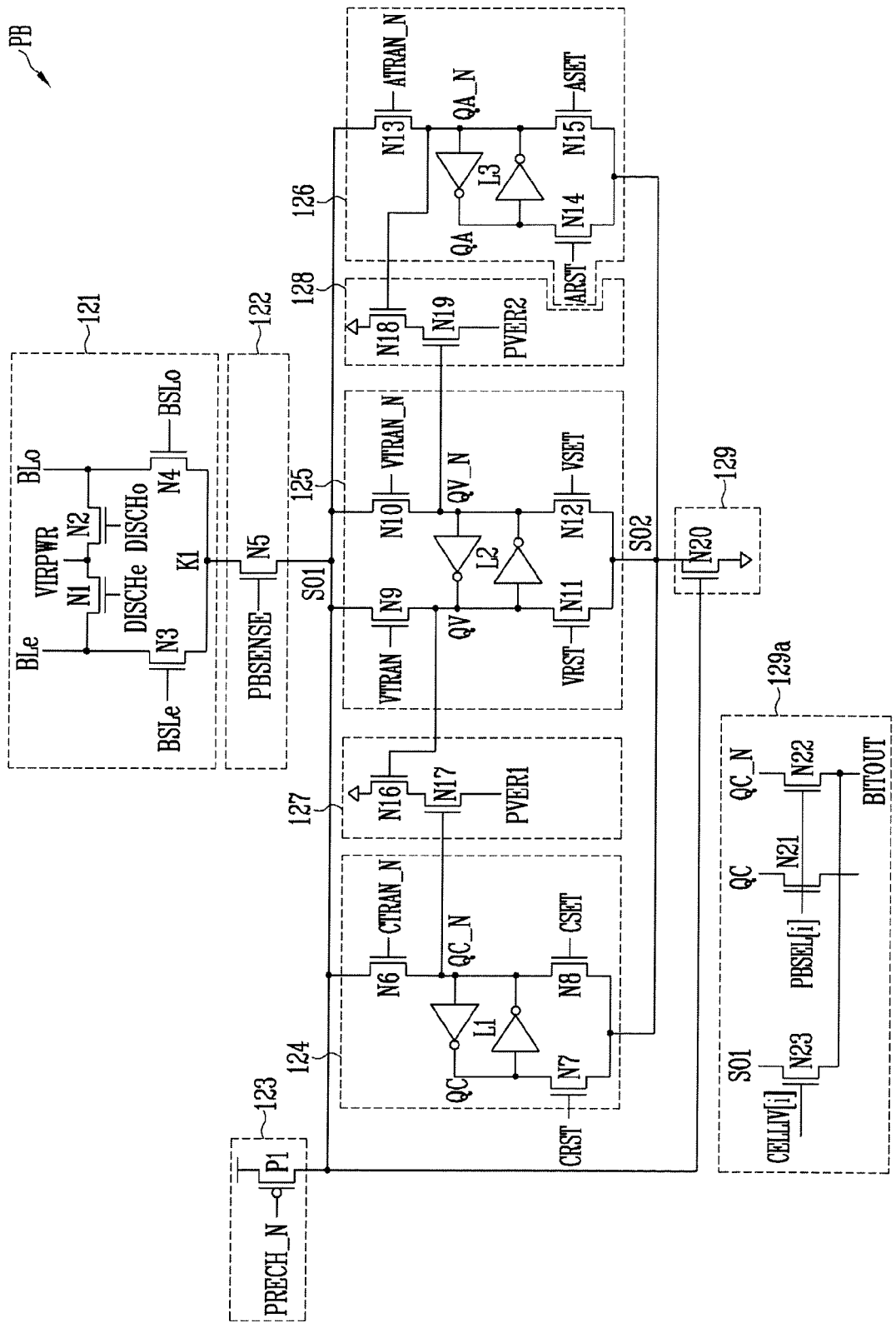
FIG. 1B is a circuit diagram of a page buffer shown in FIG. 1A.

Referring to FIG. 1B, an example circuit diagram of the page buffer 100 is depicted. The page buffer PB includes a bit line selection unit 121, a first sense unit 122, a precharge unit 123, a first latch unit 124, a second latch unit 125, a third latch unit 126, a first verification unit 127, a second verification unit 128, a second sense unit 129, and a data I/O unit 129a.

The bit line selection unit 121 selects one of the even bit line BLe and the odd bit line BLo. The first sense unit 122 detects the voltage level of a bit line selected by the bit line selection unit 121 and reflects the sensed voltage level in the first sense node SO1.

The precharge unit 123 precharges the first sense node SO1. The first, second, and third latch units 124, 124, 126 temporarily store data for a program, latch the result of verification or read data stored in a memory cell, and store the read data.

The first and second verification units 127, 128 output the result of the verification operation, latched in the first, second, and third latch units 124, 125, 126, as first and second verification signals PVER1, PVER2.

The second sense unit 129 detects the voltage level of a first sense node SO1 and couples a second sense node SO2 to a ground node. The data I/O unit 129a is coupled to first latch unit 124 and configured to input and output data to be programmed or read data. Furthermore, a cell current flowing through a bit line coupled to first sense node SO1 may be measured through the data I/O unit 129a.

The bit line selection unit 121 includes first, second, third, and fourth NMOS transistors N1, N2, N3, and N4, respectively. The first sense unit 122 includes a fifth NMOS transistor N5. The precharge unit 123 includes a first PMOS transistor P1.

As shown, the first, second, and third latch units 124, 125, 126 include sixth, seventh, eighth, ninth, tenth, eleventh, twelfth, thirteenth, fourteenth, and fifteenth NMOS transistors N6, N7, N8, N9, N10, N11, N12, N13, N14, and N15, respectively, and first, second, and third latches L1, L2, and L3, respectively.

The first and second verification units 127, 128 include sixteenth, seventeenth, eighteenth, and nineteenth NMOS transistors N16, N17, N18, and N19, respectively. The second sense unit 129 includes a twentieth NMOS transistor N20.

The data I/O unit 129a includes twenty-first, twenty-second, and twenty-third NMOS transistors N21, N22, and N23, respectively.

The first and second NMOS transistors N1, N2 are coupled in series between the even bit line BLe and the odd bit line BLo. An even discharge control signal DISCHe is inputted to the gate of the first NMOS transistor N1, and an odd discharge control signal DISCHo is inputted to the gate of the second NMOS transistor N2.

A variable voltage VIRPWR is supplied to the node of the first and second NMOS transistors N1, N2.

The third NMOS transistor N3 is coupled between the even bit line BLe and a node K1. The fourth NMOS transistor N4 is coupled between the odd bit line BLo and the node K1. An even selection signal BSLe is inputted to the gate of the third NMOS transistor N3. An odd selection signal BSLo is inputted to the gate of the fourth NMOS transistor N4.

The fifth NMOS transistor N5 is coupled between the node K1 and the first sense node SO1. A sense control signal PBSENSE is inputted to the gate of the fifth NMOS transistor N5.

The first PMOS transistor P1 is coupled between a power source terminal and the first sense node SO1. A precharge control signal PRECH_N is input to the gate of the first PMOS transistor P1.

The sixth NMOS transistor N6 is coupled between the first sense node SO1 and a node QC_N. A first data transfer signal CTRAN_N is inputted to the gate of the sixth NMOS transistor N6.

The first latch L1 includes two inverters coupled between a node QC and the node QC_N as shown. The first latch L1 functions as a latch circuit.

The seventh NMOS transistor N7 is coupled between the node QC and a second sense node SO2. The eighth NMOS transistor N8 is coupled between the node QC_N and the second sense node SO2. A first reset signal CRST is input to the seventh NMOS transistor N7. A first set signal CSET is input to the gate of the eighth NMOS transistor N8.

The ninth NMOS transistor N9 is coupled between the first sense node SO1 and a node QV. The tenth NMOS transistor N10 is coupled between the first sense node SO1 and a node QV_N. A second data transfer signal VTRAN is input to the gate of the ninth NMOS transistor N9. A third data transfer signal VTRAN_N is input to the gate of the tenth NMOS transistor N10. A reverse signal of the second data transfer signal VTRAN is the third data transfer signal VTRAN_N.

The second latch L2 includes two inverters coupled between the node QV and the node QV_N as shown. The second latch L2 functions as a latch circuit.

The eleventh NMOS transistor N11 is coupled between the node QV and the second sense node SO2. The twelfth NMOS transistor N12 is coupled between the node QV_N and the second sense node SO2. A second reset signal VRST is input to the gate of the eleventh NMOS transistor N11. A second set signal VSET is input to the gate of the twelfth NMOS transistor N12.

The thirteenth NMOS transistor N13 is coupled between the first sense node SO1 and a node QA_N. A fourth data transfer signal ATRAN_N is inputted to the gate of the thirteenth NMOS transistor N13.

The third latch L3 includes two inverters coupled between a node QA and the node QA_N as shown. The third latch L3 functions as a latch circuit.

The fourteenth NMOS transistor N14 is coupled between the node QA and the second sense node SO2. The fifteenth NMOS transistor N15 is coupled between the node QA_N and the second sense node SO2. A third reset signal ARST is input to the gate of the fourteenth NMOS transistor N14. A third set signal ASET is input to the gate of the fifteenth NMOS transistor N15.

The sixteenth and seventeenth NMOS transistors N16, N17 are coupled between the ground node and the first verification signal PVER1. The gate of the sixteenth NMOS transistor N16 is coupled to the node QV. The gate of the seventeenth NMOS transistor N17 is coupled to the node QC_N.

The eighteenth and nineteenth NMOS transistors N18, N19 are coupled in series between the ground node and the second verification signal PVER2 as shown. The gate of the eighteenth NMOS transistor N18 is coupled to the node QA_N. The gate of the nineteenth NMOS transistor N19 is coupled to the node QV_N.

The twentieth NMOS transistor N20 is coupled between the second sense node SO2 and the ground node. The gate of the twentieth NMOS transistor N20 is coupled to the first sense node SO1.

The twenty-first NMOS transistor N21 is coupled between the node QC and a node BITOUT. The twenty-second NMOS transistor N22 is coupled between the node QC_N and the node BITOUT_N. A page buffer selection signal PBSEL[i] is coupled to the gates of the twenty-first and twenty-second NMOS transistors N21, N22.

The twenty-third NMOS transistor N23 is coupled between the first sense node SO1 and the node BITOUT. A cell current measurement mode signal CELLIV[i] terminal is coupled to the gate of the twenty-third NMOS transistor N23.

The data I/O unit 129a may be included in the page buffer PB and/or the Y decoder 130.

When data of 2 bits is stored using the nonvolatile memory device 100 and the page buffer PB, distributions of the threshold voltage of the memory cells are produced.

Figure 2:
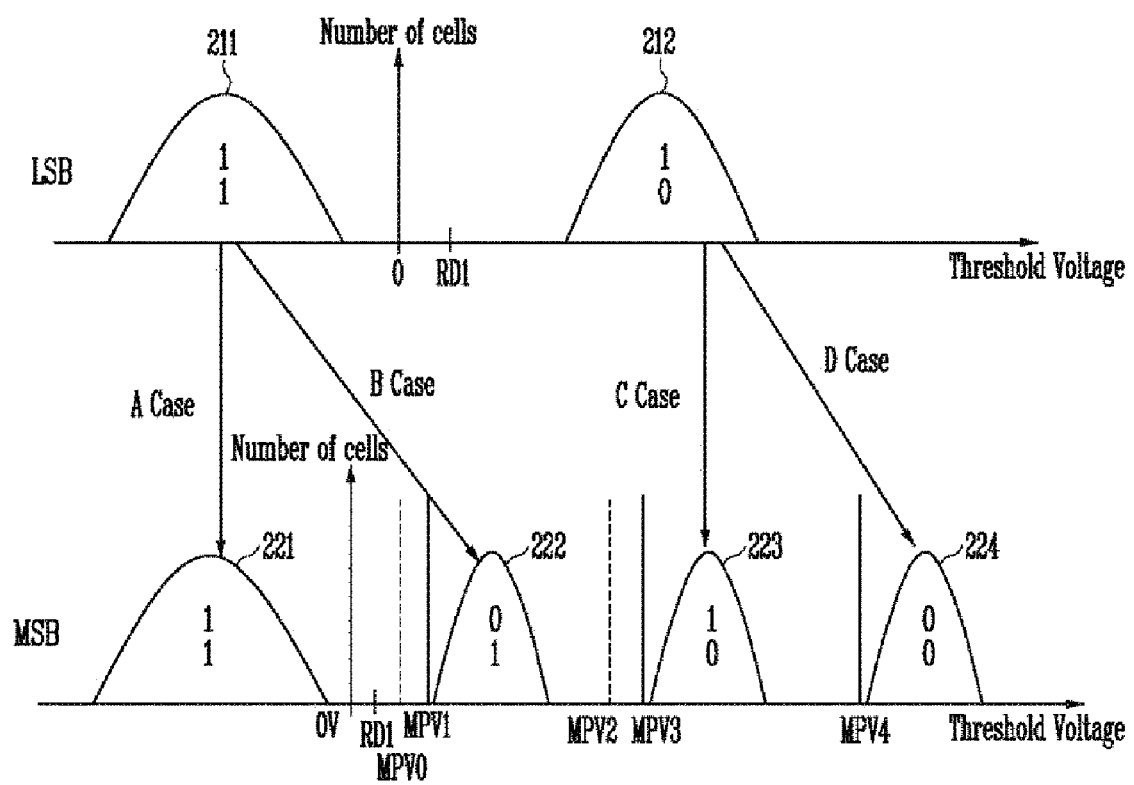
FIG. 2 is a diagram showing distributions of threshold voltages according to a program operation for memory cells shown in FIG. 1.

FIG. 2 is an example diagram showing distributions of threshold voltages according to a program operation for the memory cells shown in FIG. 1. The MLCs are each capable of storing data of 2 bits (i.e. 11, 10, 01, and 00)have four distributions of the threshold voltage through a program operation.

First, the memory cells of an erase state have the threshold voltage of 0 V or less. When a program operation is performed on an LSB page, a threshold voltage distribution 211 of the erase state and a threshold voltage distribution 212 of a program state are produced. This is because the memory cells on which the program operation has been performed have increased threshold voltages.

Next, when the program operation is performed on an MSB page, four threshold voltage distributions 221, 222, 223, 224 are produced. That is, the memory cells programmed with the threshold voltage distribution 211 of the erase state are changed to have first and second threshold voltage distributions 221, 222, respectively, through the program operation. The memory cells programmed with the threshold voltage distribution 212 of the LSB program state are changed to have third and fourth threshold voltage distributions 223, 224, respectively, through the program operation.

In cases where the threshold voltages of the memory cells (on which the LSB program has been performed) are changed to have the first and second threshold voltage distributions 221, 222 are referred to as a first case A and a second case B.

Cases where the threshold voltages of the memory cells (on which the LSB program has been performed) are changed to have the third and fourth threshold voltage distributions 223, 224 are referred to as a third case C and fourth case D.

In one embodiment, a double verification method of performing verification using two verification voltages can be performed on the memory cells programmed to have the second and third cases B, C.

Verification voltages used when the MSB page program is performed include first, second, third, fourth, and fifth verification voltages MPV0, MPV1, MPV2, MPV3, and to MPV4, respectively.

The program operation for producing threshold voltage distributions, such as that shown in FIG. 2, using the page buffer PB shown in FIG. 1B according to one embodiment of this disclosure can be performed as follows.

It is hereinafter assumed that in the state in which an LSB page program operation has been completed, an MSB page program operation is performed.

Figure 3:
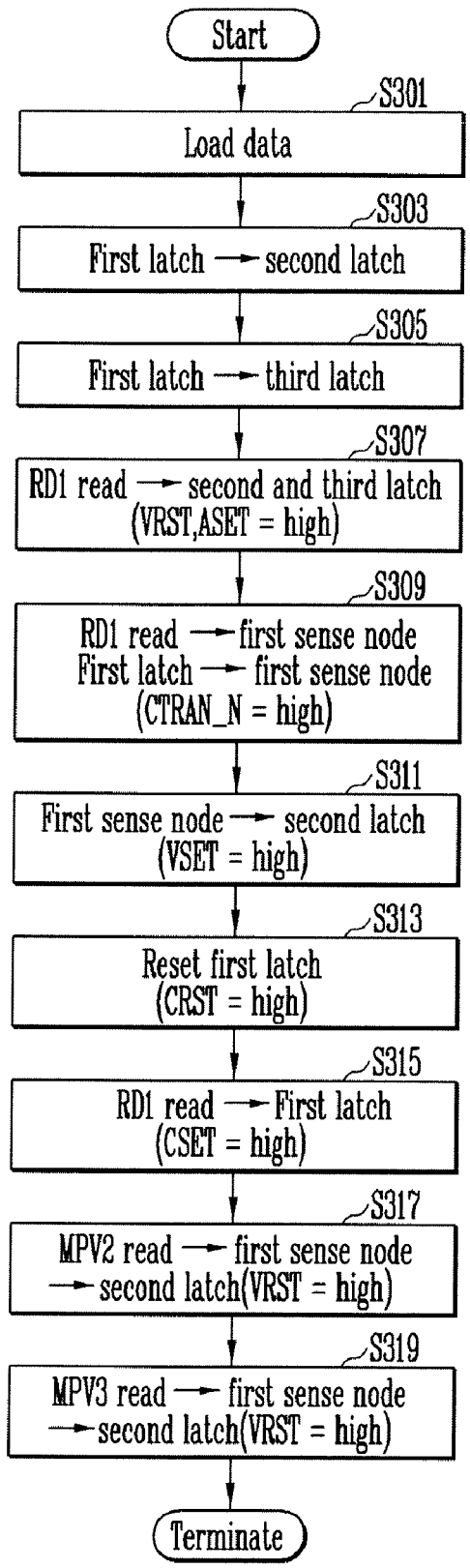
FIG. 3 is a flowchart illustrating a data setting operation using a page buffer in a program operation according to a first embodiment of this disclosure.

FIG. 3 is a flowchart illustrating a data setting operation using a page buffer in a program operation according to a first embodiment of this disclosure. After the LSB page program operation has been completed, data to be programmed is input to the first latch L1 (node QC_N) at step S301.

To simultaneously describe the four cases A, B, C, and D in which the memory cells are programmed to have the first, second, third, and fourth threshold voltage distributions 221, 222, 223, 224, the states of the nodes in the first, second, third, and fourth cases A, B, C, and D are shown in Table 1. Data of the first, second, and third latches L1, L2, L3 refer to the respective data states of the nodes QC_N, QV_N, and QA_N. Further, in Table 1, C, V, and A indicate the respective nodes QC_N, QV_N, and QA_N.

The data states of the first, second, and third latches L1, L2, L3 are shown in Table 1.

TABLE 1

|   | C | V | A | C | V | A | C | V | A | C | V | A | C | V | A |
|---|---|---|---|---|---|---|---|---|---|---|---|---|---|---|---|
| A | 1 | 1 | 1 | 1 | 1 | 1 | 1 | 1 | 1 | 1 | 1 | 1 | 1 | 1 | 1 |
| B | 0 | 0 | 0 | 0 | 0 | 0 | 0 | 0 | 0 | 1 | 0 | 0 | 1 | 0 | 0 |
| C | 1 | 1 | 1 | 1 | 1 | 0 | 1 | 0 | 0 | 1 | 0 | 0 | 0 | 0 | 0 |
| D | 0 | 0 | 0 | 0 | 1 | 0 | 0 | 1 | 0 | 1 | 1 | 0 | 0 | 1 | 0 |
| Flag | 0 | 0 | 0 | 0 | 0 | 0 | 0 | 0 | 0 | 1 | 0 | 0 | 1 | 0 | 0 |

In Table 1, 'Flag' indicates the data state of the page buffer to the flag cell is coupled. The flag memory cell is set so that it is programmed as in the second case B. The flag cell is used to indicate a program state or a non-program state, which can be used to determine whether an MSB page program has been performed on memory cells. Accordingly, the data state of the flag cell can be sufficiently determined by programming the flag cell as in the second case B. In the case where the flag cell is programmed like the third case C, the data state of the flag cell can be to be set in the third case C, if needed.

When the data is input in cases A, B, C, and D, the data states of the first latch L1 becomes '1010'. The data states of the second and third latches L2, L3 become '1111' in the respective cases A, B, C, and D.

The data loaded into the first latch L1 is transferred to the second and third latches L2, L3 at steps S303 and S305, respectively. Accordingly, the data states of the first to third latches L1 to L3 become '1010', as shown in Table 1.

Next, the program state of a selected memory cell is read using a first read voltage RD1 and then stored in the second and third latches L2 and L3 at step S307.

The operation at step S307 is described in more detail below with reference to the page buffer PB.

It is assumed that the selected memory cell is a memory cell coupled to the even bit line BLe. The first sense node SO1 is precharged to a high level in response to the precharge control signal PRECH_N of a low level. The sense control signal PBSENSE having a first voltage (V1) level and the even selection signal BSLe of a high level are input so that the even bit line BLe is coupled to the node K1. As such, the even bit line BLe is precharged.

The even selection signal BSLe shifts to a low level, thereby making the even bit line BLe a floating state. The first read voltage RD1 is supplied to the word line WL to which the selected memory cell is coupled, and a pass voltage Vpass is supplied to the remaining word lines. In this state, an evaluation operation is performed.

If the selected memory cell is in the erase state 211 in FIG. 2, the even bit line BLe is discharged. However, if the selected memory cell is in the LSB program state, the even bit line BLe maintains the precharge state.

After the evaluation operation is completed, the sense control signal PBSENSE having a second voltage (V2) level and the even selection signal BSLe of a high level are supplied so that the even bit line BLe and the node K1 are coupled together. Here, the first sense node SO1 is the precharge state.

If the even bit line BLe is discharged, the fifth NMOS transistor N5 is turned on, and the first sense node SO1 is discharged (i.e., erased) due to a charge sharing phenomenon. However, if the even bit line BLe is in a precharge state, the fifth NMOS transistor N5 maintains a turn-off state, and the first sense node SO1 also maintains a precharge state (i.e., pgm). Here, the operation of the fifth NMOS transistor N5 depends on the characteristic of an NMOS transistor, and a detailed description thereof is omitted.

To latch read results in the second and third latches L2, L3, the second reset signal VRST and the third set signal ASET are set at a high level.

If a memory cell is in the erase state, the first sense node SO1 is at a low level. As such, the twentieth NMOS transistor N20 is not turned on. Therefore, in the first and second cases A, B, there is no change in the data stored in the second and third latches L2, L3.

However, in the third and fourth cases C, D, if the memory cell is in the LSB program state, the first sense node SO1 maintains the precharge state, and the twentieth NMOS transistor N20 is turned on.

When the twentieth NMOS transistor N20 is turned on, the second sense node SO2 is coupled to the ground node. When the second reset signal VRST and the third set signal CSET set at a high level, the node QV and the node QA_N are coupled to the ground node.

Accordingly, the data states of the second latches L2 become '11' in the third and fourth cases C, D, and the data states of the third latches L3 become '00' in the third and fourth cases C, D.

Next, after the voltage level of the first sense node SO1 is changed using the first read voltage RD1, the voltage level of the first sense node SO1 is changed according to the data state of the first latch L1 at step S309.

The data state of the second latch L2 is changed according to the voltage level of the first sense node SO1 at step S311. Such an operation is referred to as a data change operation according to control of the sense node.

That is, when the selected memory cell is read using the first read voltage RD1, the voltage levels of the first sense node SO1 become '0011' in the first, second, third, and fourth cases A, B, C, D. The first and second cases A, B include memory cells having a threshold voltage lower than the first read voltage RD1. The third and fourth cases C, D include memory cells having a threshold voltage greater than the first read voltage RD1.

The data state of the node QC_N and the voltage level of the first sense node SO1 are changed in response to the first data transfer signal CTRAN_N of a high level. Accordingly, the voltage levels of the first sense node SO1 in the first, second, third, and fourth cases A, B, C, D become '0010'.

When the data state of the node QC_N is '0', the voltage level of the first sense node SO1 shifts to '0'. When the voltage level of the first sense node SO1 is '1' with the data state of the node QC_N' being '1', the voltage level of the first sense node SO1 is maintained at '1'.

However, when the data state of the node QC_N is '1' and the voltage level of the first sense node SO1 is '0', the voltage level of the first sense node SO1 cannot become '1' because the data state of the node QC_N is '1'. Accordingly, the voltage level of the first sense node SO1 is maintained at '0'.

When the second set signal VSET at a high level is supplied in the state in which the voltage levels of the first sense node SO1 are '0010' as described above, the twentieth NMOS transistor N20 is turned on and the node QV_N is coupled to the ground node (e.g., in the third case C).

Accordingly, the data states of the node QV_N in the first, second, third, and fourth cases A, B, C, D become '1001'.

Next, the first latch L1 is reset at step S313. In the operation of resetting the first latch L1, the precharge control signal PRECH_N at a low level is supplied, the first sense node SO1 is precharged to a high level, and the first reset signal CRST of a high level is supplied. As such, the data state of the node QC_N shifts to '1'.

Next, the data of the memory cell is read using the read voltage RD1 and then stored in the first latch L1 at step S315. When the data state of the memory cell is read using the read voltage RD1, the voltage levels of the first sense node SO1 become '0011'. When the first set signal CSET of a high level is supplied, the data states of the node QC_N become '1100'.

The steps S301 to S315 correspond to the data setting operation when a program operation is first started. After the data setting operation is completed, the data state of the memory cell is read using the third and fourth verification voltages MPV2, MPV3, and the data state of the second latch L2 is changed at steps S317 and S319. This is because the threshold voltage of a memory cell having a fast program speed has already risen more than the third or fourth verification voltage MPM2 or MPV3.

In the case where a double verification operation is performed as a verification method, the voltage of the bit line can be classified into three types.

To perform the program operation on the memory cell; 0 V, A V, or the power source voltage Vcc is supplied to the bit line according to a program state of the memory cells. For example, in FIG. 1, in the case in which the double verification operation is performed on the memory cells, programmed to have the second threshold voltage distribution 222, using the first and second verification voltages MPV0 and MPV1; 0 V is supplied to the bit line to which memory cells having a threshold voltage lower than the first verification voltage MPV0 are coupled.

A V is supplied to the bit line to which memory cells, having a threshold voltage between the first verification voltage MPV0 and the second verification voltage MPV1, are coupled. A V is higher than 0 V, but lower than the power source voltage Vcc. A V can slow the program speed.

The power source voltage Vcc is supplied to the bit line to which memory cells that should not be programmed are coupled in order to program-inhibit the memory cells.

Accordingly, 0 V is first supplied to the bit line to which the memory cells that should be programmed to have the second threshold voltage distribution 222 are coupled. A V is supplied to the corresponding memory cells when they are a pass for the first verification voltage MPV0. The power source voltage Vcc is supplied to the corresponding memory cells when they are a pass for the second verification voltage MPV1.

To this end, the voltage supplied to the bit line is changed according to the data states of the second and third latches L2, L3.

When the data states of the second and third latches L2, L3 are '11', the power source voltage Vcc is supplied to the bit line. When the data states of the second and third latches L2, L3 are '00' or '10', 0 V is supplied to the bit line.

When the data states of the second and third latches L2, L3 are '01', A V is supplied to the bit line. The method of supplying voltage to the bit line is known, and a detailed description thereof is omitted.

A program operation after the data setting operation is completed is described below with reference to FIG. 4.

Figure 4A:
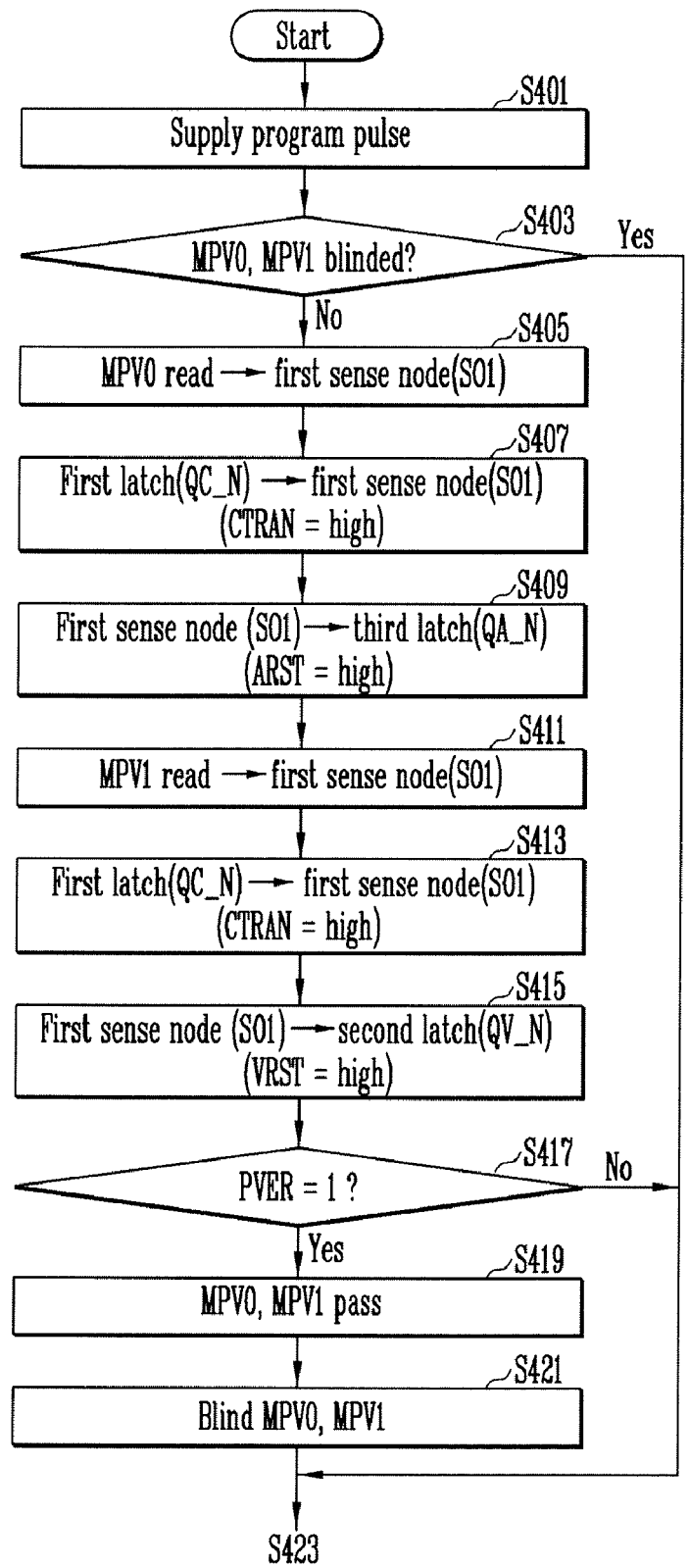
FIGS. 4A and 4B are flowcharts illustrating a program operation after a program setting operation in FIG. 3.
Figure 4B:
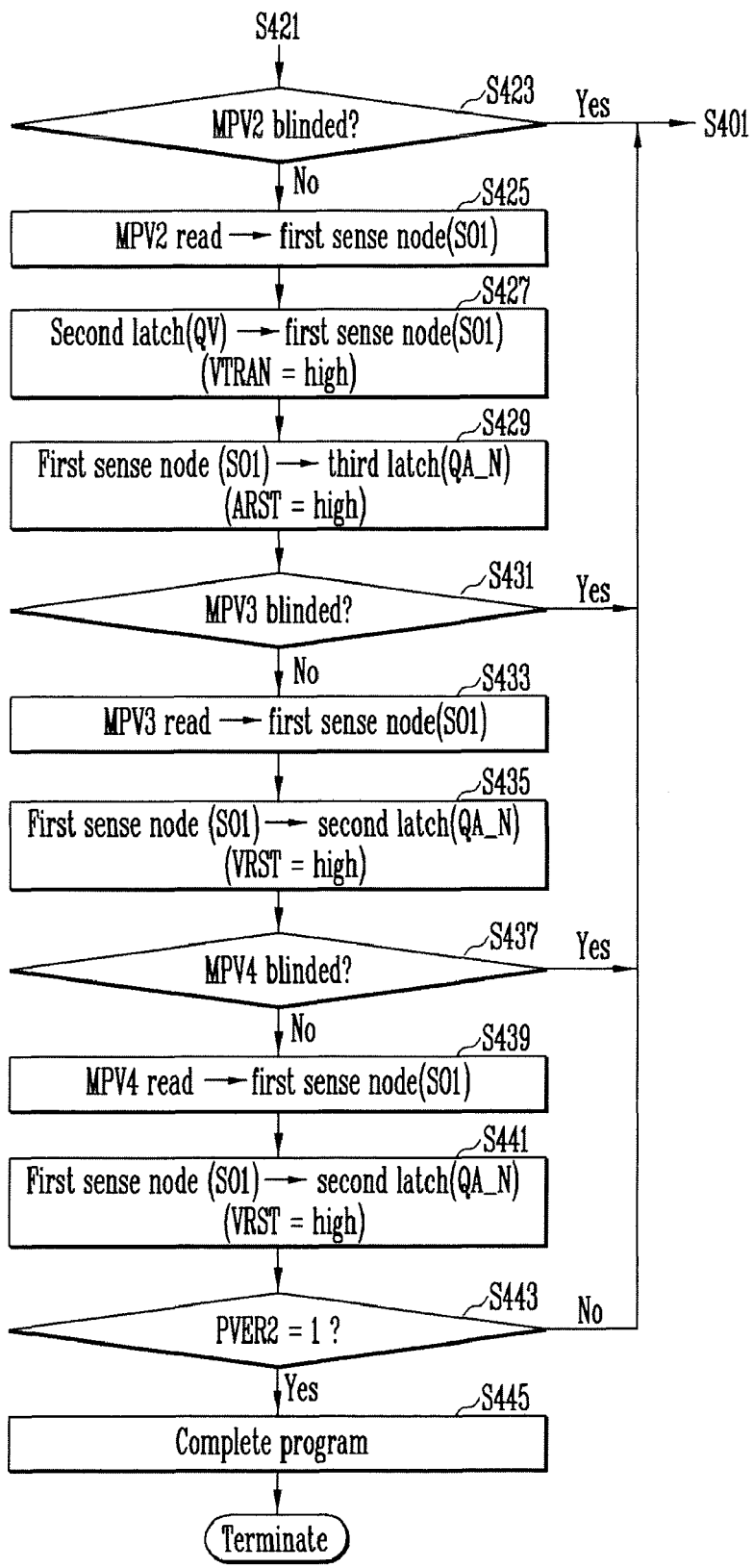

Referring to FIGS. 4A and 4B example flowcharts illustrating the program operation after the program setting operation in FIG. 3 are depicted. When a program pulse is supplied, a program is performed at step S401 (e.g., a case in which memory cells each capable of storing 2 bits are programmed).

The program process for the first, second, third, and fourth threshold voltage distributions 221, 222, 223, 224 shown in FIG. 1 is described, and a double verification operation is performed on the second and third threshold voltage distributions 222, 223 using the first, second, third, fourth, and fifth verification voltages MPV0, MPV1, MPV2, MPV3, MPV4. The verification operations using the respective verification voltages MPV0, MPV1, MPV2, MPV3, MPV4 are referred to as first, second, third, fourth, and fifth verification operations, respectively.

The operation of performing the program at step 5401 is the same as a typical program operation, and a detailed description thereof is omitted. Here, 0 V, A V, or the power source voltage Vcc is supplied to the bit line according to the data states of the first to third latches L1 to L3.

Table 2 illustrates a change of the data states of the first, second, and third latches L1, L2, L3 in the first, second, third, and fourth cases A, B, C, D during the program operation. In Table 2, C, V, and A indicate the respective nodes QC_N, QV_N, and QA_N.

TABLE 2

| | C | V | A | C | V | A | C | V | A | C | V | A | C | V | A | C | V | A |
|---|---|---|---|---|---|---|---|---|---|---|---|---|---|---|---|---|---|---|
| A | 1 | 1 | 1 | 1 | 1 | 1 | 1 | 1 | 1 | x | 1 | 1 | x | 1 | 1 | x | 1 | 1 |
| B | 1 | 0 | 0 | 1 | 0 | 1 | 1 | 1 | 1 | | 1 | 1 | | 1 | 1 | | 1 | 1 |
| C | 0 | 0 | 0 | 0 | 0 | 0 | 0 | 0 | 0 | | 0 | 0 | | 1 | 1 | | 1 | 1 |
| D | 0 | 1 | 0 | 0 | 1 | 0 | 0 | 1 | 0 | | 1 | 0 | | 1 | 0 | | 1 | 1 |

After the program operation, a verification operation is performed. It is then determined whether the first and second verification operations using the first and second verification voltages MPV0, MPV1 have been blinded at step S403. When the verification operation is performed, the threshold voltages of the memory cells may not greatly rise in the initial program operation. Furthermore, during the program/erase cycles, a start voltage may be set low in preparation for the deterioration of the data states of the memory cells, but the blind processing can be performed for a predetermined number of program pulses so that the verification operation is not performed. Furthermore, in the state in which the result of the first and second verification operations is a pass, the first and second verification operations may be blinded in order to prevent unnecessary verification operations.

If, as a result of the determination, the first and second verification operations are in the blind state, a program voltage is increased by a step voltage whenever the program pulse is supplied because the third, fourth, and fifth verification operations use an increment step pulse programming (ISPP) method in the embodiment of this disclosure.

However, if, as a result of the determination, the first and second verification operations are not in the blind state, the first verification operation using the first verification voltage MPV0 is performed. To this end, after the first sense node SO1 is precharged, a selected memory cell is read using the first verification voltage MPV1, and the voltage level of the first sense node SO1 is changed.

That is, the voltage level of the first sense node SO1 of a page buffer to which memory cells which have been a pass in the first verification operation are coupled becomes '0'. The voltage level of the first sense node SO1 of a page buffer to which memory cells which have not been a pass in the first verification operation are coupled becomes '1'.

The voltage level of the first sense node SO1 is changed according to a data state of the first latch L1 (node QC_N) at step S407. A data state of the third latch L3 (node QA_N) is changed according to the voltage level of the first sense node SO1. To this end, the third reset signal ARST of a high level is supplied at step S409.

For example, in memory cells not programmed with a threshold voltage higher than the first verification voltage as a result of the program operation, from among memory cells that should be programmed to have the second threshold voltage distribution 222, the voltage levels of the first sense node SO1 become '0011' as a result of the step S405.

Since the data states of the first latch L1 are '1100 ', the voltage levels of the first sense node SO1 become '0000' as a result of the step S407. Accordingly, after the step S409, the data states of the third latch L3 are not changed, but maintained to '1000'.

However, in memory cells programmed with a threshold voltage higher than the first verification voltage as a result of the program operation, from among memory cells that should be programmed to have the second threshold voltage distribution 222, the voltage levels of the first sense node SO1 become '0111 ' as a result of the step S405. When the step S407 is performed, the voltage levels of the first sense node SO1 become '0100 '. The data states of the third latch L3 (node QA_N) become '1100 ' according to a result of the step S409. Accordingly, the data states of the second and third latches L2, L3 (nodes QV_N, QA_N) of the memory cells that should be programmed to have the second case B become '01'. Accordingly, in a subsequent program operation, A V is supplied to the bit line.

After the first verification operation is completed, the second verification operation is performed. To this end, after the first sense node SO1 is precharged, a read operation using the second verification voltage MPV1 is performed, and the voltage level of the first sense node SO1 is changed at step S411.

The voltage level of the first sense node SO1 is changed according to the data state of the first latch L1 (node QC_N) at step S413. Next, the second reset signal VRST of a high level is supplied so that the data state of the second latch L2 (node QV_N) is changed according to the voltage level of the first sense node SO1 at step S415.

For example, in a page buffer coupled to memory cells having a threshold voltage lower than the second verification voltage MPV1, the voltage levels of the first sense node SO1 become '0011' as a result of the step S411. When the step S413 is performed, the voltage levels of the first sense node SO1 become '0000'. Accordingly, the data state of the second latch L2 (node QV_N) as a result of the step S415 is not changed.

However, in memory cells programmed to have a threshold voltage higher than the second verification voltage MPV1, the data states of the third latch L3 (node QA_N) are '1100 '. When the step S411 is performed. The voltage levels of the first sense node SO1 become '0111'.

As a result of the step S413, the voltage levels of the first sense node SO1 become '0100 '. As a result of the step S415, the data states of the second latch L2 (node QV_N) become '1101 '. Accordingly, in the second case B, the data states of the second and third latches L2, L3 (node QV_N, QA_N) become '11', a subsequent program operation is inhibited.

After the first and second verification operations are completed, the first verification signal PVER1 is checked at step S417. If, as a result of the check, the first verification signal PVER1 is in a high level, both the first and second verification operations are determined to be a pass at step S419, and the first and second verification operations are then blinded so that they are not performed at step S421.

After the first and second verification operations are blinded or the first verification signal PVER1 is determined not to be '1 ', it is checked whether a third verification operation has been blinded at step S423.

In a nonvolatile memory device, the number of program pulses are set differently so that verification is performed on memory cells programmed to have a high threshold voltage distribution in a program operation. The reason is described below. A probability that memory cells that should be programmed to have a high threshold voltage, will be a pass is low although verification is performed on memory cells at the early stage, and the time that it takes to perform the verification operation is increased. Accordingly, in one embodiment of this disclosure, verification operations on the memory cells programmed to belong to the third and fourth threshold voltage distributions 223, 224 are blinded so that the verification operations are performed after a predetermined number of program pulses are supplied.

After a predetermined number of the program pulses are supplied, the blind processing is released.

If, as a result of the check at step S423, the third verification operation has been blinded, the fourth and fifth verification operations are also in the blind state. Accordingly, the process returns to the step S401 in which the program operation is performed by supplying a program pulse.

However, if, as a result of the check at step S423, the third verification operation has not been blinded, the third verification operation is performed. To this end, after the first sense node SO1 is precharged, the voltage level of the first sense node SO1 is changed using the third verification voltage MPV2 at step S425. The voltage level of the first sense node SO1 is changed according to a data state of the second latch L2 (node QV) at step S427. To this end, the first data transfer signal VTRAN of a high level is supplied so that the voltage level of the first sense node SO1. The third reset signal ARST of a high level is supplied according to the voltage level of the first sense node SO1 so that a data state of the third latch L3 (node QA_N) is changed at step S429.

The above process is described in more detail below.

In the case in which memory cells programmed using the third verification voltage MPV2 or more do not exist, the voltage levels of the first sense node SO1 become '0000' for the third verification voltage MPV2. The data states of the second latch L2 (node QV) become '0110' or '0010'.

When the step S427 is performed according to the data state of the second latch L2 (node QV), the voltage levels of the first sense node SO1 becomes '0000'. When the step S429 is performed, the data states of the third latch L3 (node QA_N) maintain '1100'.

In the case in which memory cells programmed using the third verification voltage MPV2 or more exist, if the step S425 is performed, the voltage levels of the first sense node SO1 become '0011'. When the step S427 is performed, the voltage levels of the first sense node SO1 become '0010'. When the step S429 is performed, the data states of the third latch L3 (node QA_N) become '1110'.

In response thereto, in the case of the third case C, the data states of the second and third latches L2, L3 (nodes QV_N, QA_N) become '01'. Accordingly, in a subsequent program operation, A V is supplied to the bit line.

After the third verification operation, it is checked whether a fourth verification operation using the fourth verification voltage MPV3 has been blinded at step S431. If, as a result of the check, the fourth verification operation has not been blinded, the voltage level of the first sense node SO1 is changed by performing a read operation using the fourth verification voltage MPV3 at step S433. In response to the voltage level of the first sense node SO1, the first reset signal VRST of a high level is supplied so that a data state of the second latch L2 (node QV_N) is changed at step S435.

The voltage levels of the first sense node SO, changed by the fourth verification voltage MPV3, are '0001' or '0011'. The data states of the second latch L2 (node QV_N) on which the third verification operation has been completed are '1001' or '1101'.

When the step S435 is performed, the data states of the second latch L2 (node QV_N) become '1011' or '1111'. As such, if the fourth verification operation is a pass only in the third case C, the data state of the second latch L2 (node QV_N) shifts to '1'.

In the memory cells that should be programmed to have the third case C, if the fourth verification operation is a pass, the data states of the second and third latches L2, L3 (nodes QV_N, QA_N) become '11'. Accordingly, a subsequent program operation is inhibited.

It is checked whether a fifth verification operation using the fifth verification voltage MPV4 has been blinded at step S437. If, as a result of the check at step S437, the verification operation has not been blinded, the fifth verification operation using the fifth verification voltage MPV4 is performed, and a result of the verification operation is stored in the second latch QA_N at step S439 and step S441.

It is then determined whether the second verification signal PVER2 according to the data of the second latch QA_N is '1' at step S443. If, as a result of the determination, the second verification signal PVER2 is determined to be '1', the program is determined to be a pass, and so the program operation is terminated at step S445. However, if, as a result of the determination at step S443, the second verification signal PVER2 is determined not to be '1', the process returns to step S403.

In the fifth verification operation using the fifth verification voltage MPV4, only the fourth case D is influenced. In a page buffer to which the memory cells programmed to have the fourth case D are coupled, when the fifth verification operation is a pass, the data states of the second and third latches L2, L3 (nodes QV_N, QA_N) become '11', and the memory cells are program-inhibited.

Accordingly, if the first, second, third, and fourth cases A, B, C, D are a program pass, the data states of the second and third latches L2, L3 (nodes QV_N, QA_N) become '1111'.

In accordance with the above method, a double verification operation can be performed on the second and third cases B, C using the page buffer PB including the three latches.

Meanwhile, in the case in which a partial program method can be applied to the memory cell array 110, an initial data setting process is slightly different from that of the above method. In the data setting process, shown in FIG. 3, the process from the step S301 to the step S315 is identical with that of the partial program method, but the process of checking the data state of the flag cell is different from that of the partial program method.

Figure 5A:
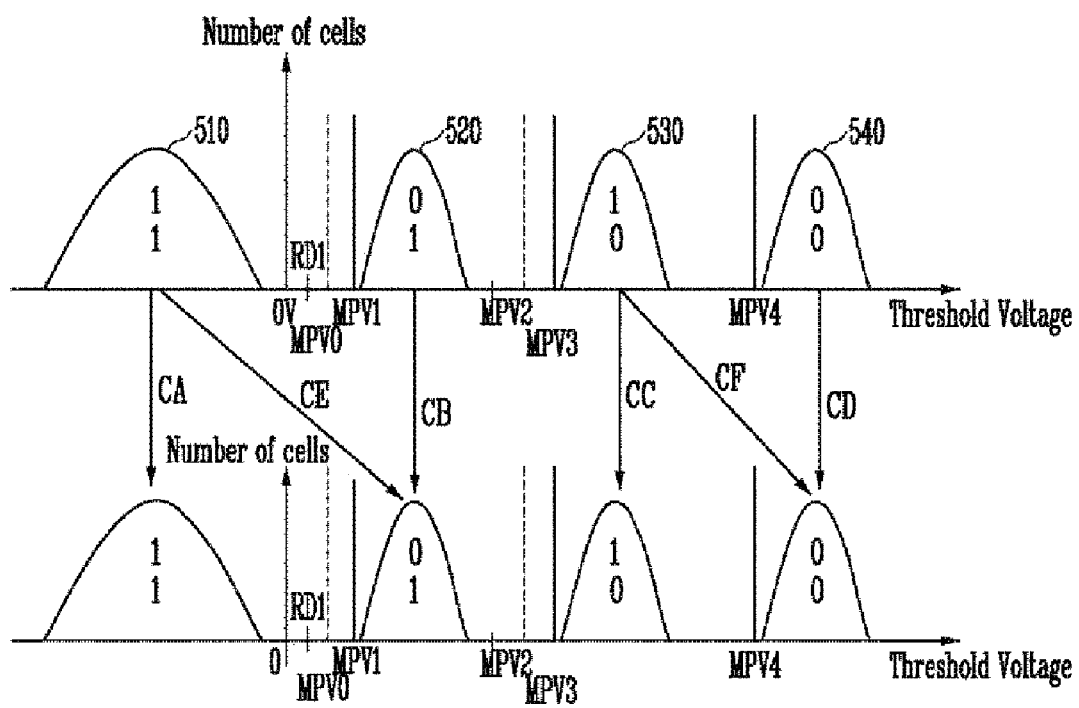
FIGS. 5A and 5B are diagrams illustrating a program data setting process according to a second embodiment of this disclosure.
Figure 5B:
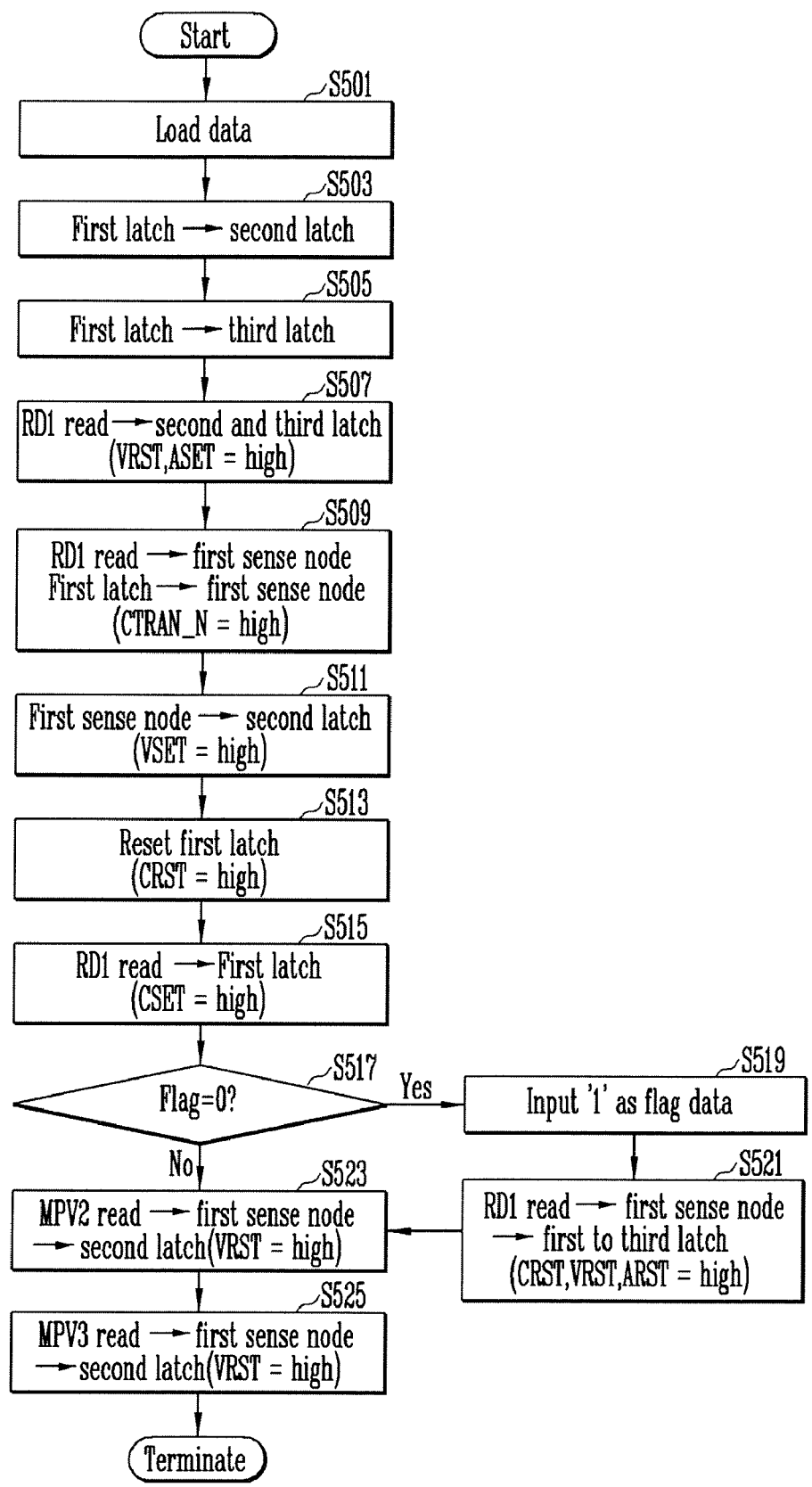

FIGS. 5A and 5B are example diagrams illustrating a program data setting process according to a second embodiment of this disclosure. More specifically, FIG. 5A illustrates a case in which the threshold voltage has shifted when there are memory cells already programmed (i.e., 11, 01, 10, and 00) by the partial program method, and FIG. 5B is a flowchart illustrating a data setting operation according to FIG. 5A.

Referring to FIG. 5A, in the partial program method, it is assumed that flag cells are included in the memory cell array 110. In the partial program operation, data '0' is programmed into the flag cell.

An LSB page program operation is the same as a conventional one. However, in the case in which the partial program operation has already been performed on an MSB page, the flag cell is programmed to have '0'.

Some of the memory cells have already been programmed to have first, second, third, and fourth threshold voltage distributions 510, 520, 530, 540, respectively, and the remainder of the memory cells on which an MSB page program operation has not been performed is programmed to have the first and third threshold voltage distributions 510, 530.

In the case in which a program operation is performed on the memory cells, the memory cells are programmed to have first, second, third, fourth, fifth, and sixth cases CA, CB, CC, CD, CE, CF, respectively. When a program operation is performed on the memory cells, the memory cells are programmed (i.e., 11, 01, 10, and 00) to have the fifth and sixth cases CE, CF, and the remaining cases should be program-inhibited.

Accordingly, the program setting process is performed as shown in FIG. 5B.

The data states of the latches of the page buffer in the cases A to F are illustrated in Table 3.

TABLE 3

|      | C | V | A | C | V | A | C | V | A | C | V | A | C | V | A |
|------|---|---|---|---|---|---|---|---|---|---|---|---|---|---|---|
| A    | 1 | 1 | 1 | 1 | 1 | 1 | 1 | 1 | 1 | 1 | 1 | 1 | 1 | 1 | 1 |
| B    | 1 | 1 | 1 | 1 | 1 | 0 | 1 | 0 | 0 | 0 | 0 | 0 | 1 | 1 | 1 |
| C    | 1 | 1 | 1 | 1 | 1 | 0 | 1 | 0 | 0 | 0 | 0 | 0 | 1 | 1 | 1 |
| D    | 1 | 1 | 1 | 1 | 1 | 0 | 1 | 0 | 0 | 0 | 0 | 0 | 1 | 1 | 1 |
| E    | 0 | 0 | 0 | 0 | 0 | 0 | 0 | 0 | 0 | 1 | 0 | 0 | 1 | 0 | 0 |
| F    | 0 | 0 | 0 | 0 | 1 | 0 | 0 | 1 | 0 | 0 | 1 | 0 | 0 | 1 | 0 |
| Flag | 0 | 0 | 0 | 0 | 1 | 0 | 0 | 1 | 0 | 1 | 0 | 0 | 1 | 1 | 0 |

In Table 3, 'Flag' indicates the data state of the page buffer to the flag cell. First, data '0' is input to the flag cell because the flag cell has to be programmed during an MSB program. The flag cell can be set so that it is programmed like the second case CB. The flag cell does not need to be classified into several threshold voltage levels because it has only a program state and a non-programmed state. Accordingly, if the flag cell is programmed like the second case CB, whether a program has been performed can be determined on the basis of the data state of the flag cell.

Referring to FIG. 5B, for the first to sixth cases (i.e., CA, CB, CC, CD, CE, CF), data is first loaded into the first latch L1 (node QC_N) at step S501. The data is transferred to the second and third latches L2, L2 (node QV_N, QA_N) at steps S503 and S505, respectively.

The data states of the second and third latches L2, L3 (node QV_N, QA_N) are changed using a first read voltage RD1 at step S507.

To this end, the first sense node SO1 is precharged, and the first sense node SO1 is changed using the first read voltage RD1. Thus, the voltage levels of the first sense node SO1 become '011101' in the first to sixth case CA, CB, CC, CD, CE, CF.

In response to the second reset signal VRST at a high level, the data states of the second latch L2 (node QV_N) shift to '111101' in the first to sixth case CA, CB, CC, CD, CE, CF.

In response to the third set signal CSET of a high level, the data states of the third latch L3 (node QA_N) shift to '10000' in the first to sixth case CA, CB, CC, CD, CE, CF.

Next, the voltage levels of the first sense node SO1 are changed according to the data states of the first latch L1 (node QC_N) at step S509.

The voltage levels of the first sense node SO1 are changed to '011101' by the first read voltage RD1. The voltage levels of the first sense node SO1 are changed according to the data states of the first latch L1 (node QC_N) in response to the first data transfer signal CTRAN_N of a high level. Thus, the voltage levels of the first sense node SO1 become '011100'.

The second set signal VSET of a high level is supplied according to the voltage level of the first sense node SO1, and so the data states of the first latch L1 (node QC_N) are changed to '100001'.

The first latch L1 (node QC_N) is reset at step S513. The voltage levels of the first sense node SO1 are changed using the first read voltage RD1. Next, the data states of the first latch L1 (node QC_N) are changed according to the voltage levels of the first sense node SO1 at step S515.

When the first latch L1 (node QC_N) is reset, the first sense node SO1 is precharged to a high level. The data states of the node QC_N become '11111 ' in response to the first reset signal CRST at a high level.

The voltage levels of the first sense node SO1 are changed to '011101' by the first read voltage RD1. In response to the first set signal CSET of a high level, the data states of the first latch L1 (node QC_N) become '100010'.

The data setting operation at steps S501 to S515 are the same as the data setting operation described with reference to FIG. 3. In one embodiment, however, a process of checking the data state of the flag cell is required because the partial program operation has already been performed.

More particularly, it is checked whether the data state of the flag cell is '0' at step S517. If, as a result of the check, the data state of the flag cell is '0', it means that the program operation has already been performed, and so data '1 ' is input to the latches of the page buffer PB to which the flag cell is coupled so that the flag cell is program-inhibited at step S519.

To this end, the voltage levels of the first sense node SO1 are changed to '011101' using the first read voltage RD1. The voltage levels of the first sense node SO1 are changed according to the data state of the second latch L2 (node QV). Next, the data states of the first to third latches L1, L2, L3 (nodes QC_N, QV_N, and QA_N) are changed according to the changed voltage levels of the first sense node SO1 at step S521.

In response to the second data transfer signal VTRAN at a high level, the voltage levels of the first sense node SO1 are changed according to the data state of the second latch L2 (node QV). Thus, the voltage levels of the first sense node SO1 become '011100'.

When the first, second, and third reset signals CRST, VRST, ARST are input at a high level, the data states of the first latch L1 (node QC_N) become '11110 ' according to the voltage levels of the first sense node SO1, the data states of the second latch L2 (node QV_N) become '111101 ', and the data states of the third latch L3 (node QA_N) become '111100'.

Furthermore, as shown in Table 3, the first to third latches L1, L2, L3 (QC_N, QV_N, and QA_N) become '110 '. Accordingly, the flag cell is fixed like the second case B as shown in Table 1. As described above, the flag cell should be programmed like the second case B or CB. Only when the flag cell is programmed like the second case B shown in FIG. 2, the flag cell can be normally programmed. This is because the second case CB in FIG. 5A is set to be program-inhibited and so the flag cell may not be programmed.

The memory cell is set as described above and is programmed as described above with reference to FIGS. 4A and 4B. In one embodiment (e.g., in which the partial program operation has been performed), an actual double verification operation can be performed on the fifth case CE.

After the data state of the flag cell is set, the verification operations using the third and fourth verification voltages MPV2, MPV3 can be performed so that the programmed memory cells are also program-inhibited at steps S523, S525 as shown in FIG. 3.

Meanwhile, if the first latch L1 is no longer used during the program operation (i.e., after the first and second verification operations are a pass), the number of fail bits is counted in order to perform an intelligent verification operation. To this end, after the first and second verification operations become a pass, a column scan for counting the number of fail bits can be performed whenever the verification operation is performed. However, because the time that it takes to count the number of fail bits is long, the column scan can be performed on the last program pulse or several program pulses.

Figure 6:
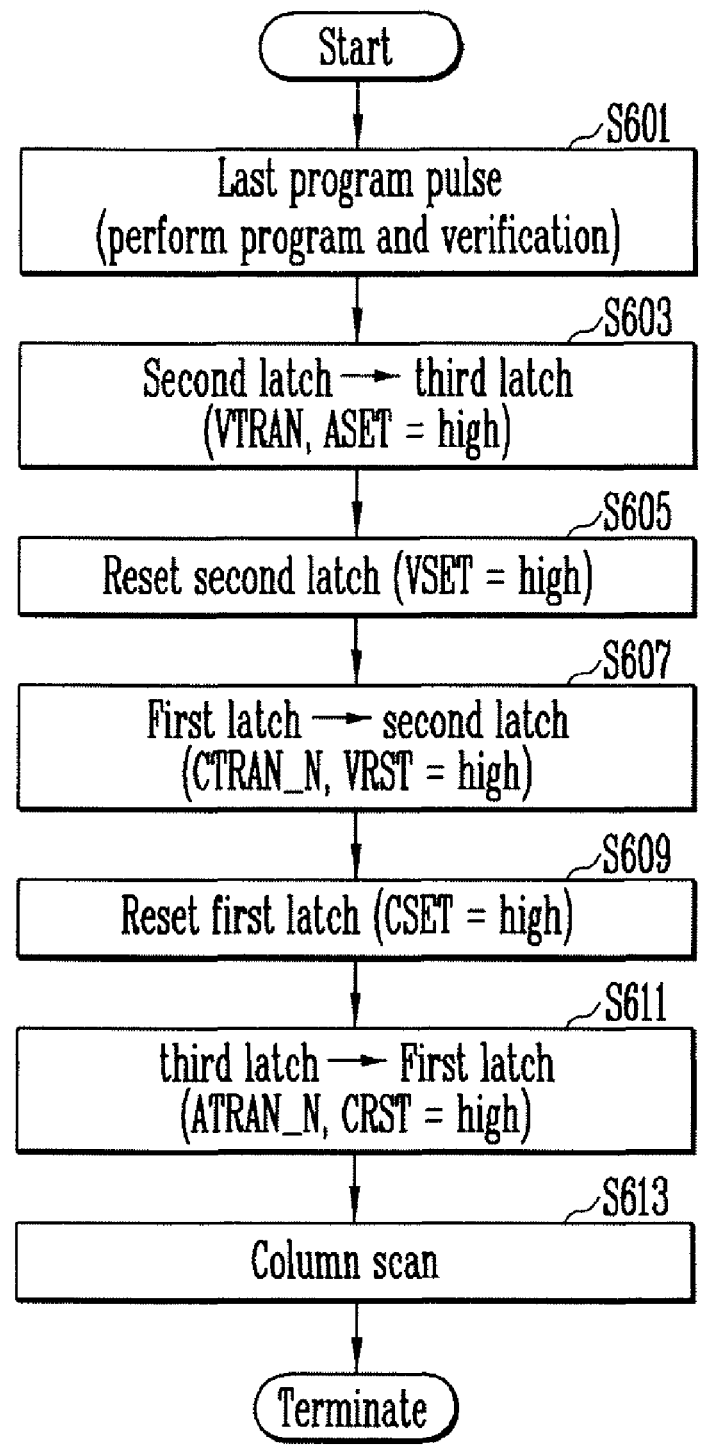
FIG. 6 is a flowchart illustrating a fail bit check operation for the intelligent verification operation after the last program pulse is supplied.

FIG. 6 is an example flowchart illustrating a fail bit check operation for the intelligent verification operation after the last program pulse is supplied. More specifically, FIG. 6 illustrates the operation of counting the number of fail bits after the program operation and the verification operation according to the last program pulse are performed. The verification operation is performed like that of FIGS. 4A and 4B.

Since the first and second verification operations have already been a pass, the first latch L1 is not used. Accordingly, the data states of the latches are changed as in Table 4.

TABLE 4

|   | C | V | A | C | V | A | C | V | A | C | V | A |
|---|---|---|---|---|---|---|---|---|---|---|---|---|
| A | 1 | 1 |   | 0 | 1 |   |   | 1 | 0 | 1 | 1 | 1 |
| B | 1 | 1 |   | 0 | 1 |   |   | 1 | 0 | 1 | 1 | 1 |
| C | 0 | 1 |   | 0 | 0 |   |   | 0 | 0 | 0 | 0 | 0 |
| D | 1 | 0 |   | 0 | 0 |   |   | 0 | 0 | 0 | 0 | 0 |

Next, the program and verification operations according to the last program pulse are completed at step S601. An operation of changing data for counting the number of fail bits is described on the assumption that the data states of the second latch L2 (node QV_N) become '1101' and the data states of the third latch L3 (node QA_N) become '1110' if the results of the fourth and fifth verifications are a fail. Here, the first latch L1 is not used.

To perform the column scan, pieces of fail information on the second and third latches L2, L3 are combined into one and output. In the page buffer PB shown in FIG. 1B, the data I/O unit 129a is coupled to the first latch L1. Accordingly, the pieces of fail information on the second and third latches L2, L3 should be combined into one latch and output through the first latch L1.

To this end, the data of the second latch L2 is transferred to the third latch L3 at step S603. The first sense node SO1 is precharged, and the voltage level of the first sense node SO1 is changed in response to the second data transfer signal VTRAN.

Since the data states of the second latch L2 are as in Table 4, the voltage levels of the first sense node SO1 become '0011' and become '1100' in response to the third set signal ASET at a high level. A case in which the data state of the latch is '0' is in the fail state. Accordingly, data, when both the verification operations using the fourth and fifth verifications MPV3, MPV4 are a fail is stored in the third latch L3, and so the third and fourth cases C, B become '0'.

The second latch L2 is reset at step S605, and the data of the first latch L1 is transferred to the second latch L2 at step S607. This is for the purpose of protecting cache data because the cache data can be stored in the first latch L1 when a cache program operation is performed.

To reset the second latch L2, the first sense node SO1 is precharged and the second set signal VSET at a high level is supplied. To move the data of the first latch L1 to the second latch L2, the first data transfer signal CTRAN_N and the second reset signal VRST of a high level are supplied.

After the first latch L1 is reset again at step S609, the data of the third latch L3 is moved to the first latch L1 at step S611, and a column scan is then performed at step S613.

To reset the first latch L1, the first set signal CSET at a high level is supplied. To move the data of the third latch L3 to the first latch L1, the fourth data transfer signal ATRAN_N and the first reset signal CRST at a high level are supplied.

After the column scan is performed, the cache data stored in the second latch L2 is moved to the first and the third latches, and the data setting operation, such as that shown in FIG. 3 or 5B, is then performed.

Through the above operation, the double verification operations can be performed on the second and third threshold voltage distributions 222, 223 in the page buffer PB having the three latches.

The page buffer PB coupled to MLCs each capable of storing one or more pieces of bit information requires two latches for controlling voltage of the bit line for the purpose of a program operation and a latch for performing the operation of a flag latch for a double verification operation. In particular, in the case in which the double verification operation for two threshold voltage distributions is performed, two flag latches are required. Accordingly, to improve a threshold voltage distribution, the number of latches that should be included in the page buffer PB is increased with an increase in the threshold voltage distribution on which the double verification operation is performed.

In the embodiment of this disclosure described above, the operation of the flag latch can be performed in the first latch L1 corresponding to the cache latch, and the function of the flag latch for distinguishing the data states can be performed in the second and third latches L2, L3 operated for control of the bit line control. Accordingly, when a double verification operation for the two threshold voltage distributions is performed, a program operation can be performed using the three latches.

Furthermore, in a page buffer to which MLCs each capable of storing data of 3 bits are coupled, a data setting operation is performed such that a cache latch functions as a flag latch and as a flag latch even in latches for controlling voltage of a bit line. Accordingly, a double verification operation for several threshold voltages may be performed with a reduction in the number of latches.

As described above, in the method of programming the nonvolatile memory device according to this disclosure, the number of threshold voltage distributions on which a double verification operation is performed is increased while a latch is not added to a page buffer. Accordingly, a data read margin can be secured and reliability of data can be improved while the area is not significantly increased.

Those skilled in the art can now appreciate from the foregoing description that the broad teachings of the present disclosure can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A method of programming a nonvolatile memory device comprising memory cells, coupled to bit lines and word lines, and page buffers each coupled to one or more of the bit lines, the method comprising:

performing a program operation and a verification operation on a first logical page of a plurality of logical pages included in memory cells selected for the program operation;

loading data for the program operation for a second logical page of the plurality of logical pages into a first latch, a second latch, and a third latch of a selected page buffer of a plurality of page buffers, coupled to the selected memory cells;

changing states of the data, stored in the second and third latches, according to a program state of the selected memory cells;

changing a state of the data stored in the second latch according to the program state of the selected memory cells and the data state of the first latch;

resetting the first latch;

storing a result of the program operation for the first logical page in the first latch; and shifting a first, second, third, and fourth threshold voltage distribution according to states of the data of the first, second, and third latches; and performing verification operations using two of a plurality verification voltages for each of the second and third threshold voltage distributions.

2. The method of claim 1, wherein loading data for the program operation comprises:

loading the data to be programmed into the second logical page into the first latch; and transferring the data of the first latch to the second and third latches.

3. The method of claim 1, wherein:

memory cells having the first threshold voltage distribution are in an erase state, verification operations, using a first and second verification voltage of the plurality of verification voltages, are performed to verify memory cells to be programmed to have the second threshold voltage distribution, verification operations, using a third and fourth verification voltage, are performed to verify memory cells to be programmed to have the third threshold voltage distribution, a verification operation, using a fifth verification voltage, is performed to verify memory cells to be programmed to have the fourth threshold voltage distribution, the threshold voltages of the memory cells having the second threshold voltage distribution are higher than the first threshold voltage distribution, the threshold voltages of the memory cells having the third threshold voltage distribution are higher than the second threshold voltage distribution, and the threshold voltages of the memory cells having the fourth threshold voltage distribution are higher than the third threshold voltage distribution.

4. The method of claim 3, wherein changing states of the data, stored in the second and third latches, according to a program state of the selected memory cells and changing a state of the data stored in the second latch according to the program state of the selected memory cells and the data state of the first latch, in the data setting step comprises:

precharging a sense node of the selected page buffer;

changing a voltage level of the sense node according to the program state of the selected memory cells;

changing a state of the data of the second and third latches according to the voltage level of the sense node;

precharging the sense node;

changing a voltage level of the sense node according to a state of the data of the first latch; and changing the state of the data of the second latch according to the voltage level of the sense node.

5. The method of claim 4, further comprising:

checking whether there are memory cells programmed to have the third threshold voltage distribution; and changing the state of the data of the second latch according to a result of the check.

6. The method of claim 5, wherein checking whether there are memory cells programmed to have the third threshold voltage distribution comprises:

precharging the sense node and changing a voltage level of the sense node by performing a data read operation using the third verification voltage;

changing the state of the data of the second latch according to the voltage level of the sense node;

precharging the sense node and changing a voltage level of the sense node by performing a data read operation using the fourth verification voltage; and changing the state of the data of the second latch according to the voltage level of the sense node.

7. The method of claim 6, wherein verifying the memory cells to be programmed to have the second threshold voltage distribution comprises:

performing a program operation on the memory cells according to the state of the data of the first to third latches;

performing a first verification by:

performing a read operation using the first verification voltage;

changing the voltage level of the sense node according to the state of the data of the first latch; and changing the data state of the third latch according to the voltage level of the sense node; and performing a second verification by:

performing a read operation using the second verification voltage;

changing the voltage level of the sense node according to the data state of the first latch; and changing the data state of the second latch according to the voltage level of the sense node; and determining whether the first and second verification operations have been a pass based on a first verification signal generated according to the state of the data of the first and second latches.

8. The method of claim 7, wherein if, as a result of the determination, the first and second verification operations are determined to be a pass, the first and second verification operations are blinded.

9. The method of claim 7, wherein verifying the memory cells to be programmed to have the third threshold voltage distribution comprises:

performing a third verification by:

performing a read operation using the third verification voltage;

changing the voltage level of the sense node according to the state of the data of the second latch; and changing the state of the data of the third latch according to the voltage level of the sense node; and performing a fourth verification by:

performing a read operation using the fourth verification voltage; and changing the state of the data of the second latch according to the voltage level of the sense node.

10. The method of claim 9, wherein verifying the memory cells to be programmed to have the fourth threshold voltage distribution comprises:
performing a fifth verification by:
performing a read operation using the fifth verification voltage; and
changing the data state of the second latch according to the voltage level of the sense node; and
determining whether the third to fifth verification operations are a pass based on a second verification signal generated according to the state of the data of the second and third latches.

11. The method of claim 10, further comprising, if the first, second, third, fourth, and fifth verification operations are determined not to be a pass:
raising a program voltage;
performing the program operation using the raised program voltage; and
performing the first, second, third, fourth, and fifth verification operations.

12. A method of programming a nonvolatile memory device comprising memory cells, coupled to bit lines and word lines, and page buffers each coupled to one or more of the bit lines, the method comprising:
performing a program operation and verification operation on a first logical page of a plurality of logical pages included in memory cells selected for a program operation;
loading data to be programmed into a second logical page of the plurality of logical pages into a first latch, a second latch, and third latch of a selected page buffer, coupled to the selected memory cells;
performing a data setting operation; and
programming the second logical page so that a distribution of threshold voltages of the selected memory cells has one of: a first, second, third, and fourth threshold voltage distribution according to states of the data of the first, second, and third latches; and
performing verification operations for the first, second, third, and fourth threshold voltage distributions,
wherein each of the verification operations for the second and third threshold voltage distributions is performed using two of a plurality of verification voltages.

13. The method of claim 12, wherein performing each of the verification operations for the second and third threshold voltage distributions using two verification voltages comprises:
performing a data loading operation by loading data for the program operation on the second logical page into the first, second, and third latches of the selected page buffer;
performing a data change operation by:
changing the states of the data of the second and third latches according to a program state of the selected memory cells; and
changing the state of the data of the second latch according to the program state of the selected memory cells and the state of the data of the first latch;
performing a data setting operation by:
resetting the first latch; and
storing a result of the program operation on the first logical page in the first latch.

14. The method of claim 13, wherein the data loading operation comprises:
loading the data to be programmed into the second logical page into the first latch; and transferring the data of the first latch to the second and third latches.

15. The method of claim 13, wherein:
memory cells having the first threshold voltage distribution are in an erase state,
verification operations using a first and second verification voltage of the plurality of verification voltages are performed to verify memory cells to be programmed to have the second threshold voltage distribution,
verification operations using a third and fourth verification voltage of the plurality of verification voltages are performed to verify memory cells to be programmed to have the third threshold voltage distribution,
a verification operation using a fifth verification voltage of the plurality of verification voltages is performed to verify memory cells to be programmed to have the fourth threshold voltage distribution,
the threshold voltages of the memory cells having the second threshold voltage distribution are higher than the first threshold voltage distribution,
the threshold voltages of the memory cells having the third threshold voltage distribution are higher than the second threshold voltage distribution, and
the threshold voltages of the memory cells having the fourth threshold voltage distribution are higher than the third threshold voltage distribution.

16. The method of claim 15, wherein the data change operation comprises:
precharging a sense node of the selected page buffer;
changing a voltage level of the sense node according to the program state of the selected memory cells;
changing the states of the data of the second and third latches according to the voltage level of the sense node;
precharging the sense node;
changing a voltage level of the sense node according to the state of the data of the first latch; and
changing the state of the data of the second latch according to the voltage level of the sense node.

17. The method of claim 16, further comprising checking whether there are memory cells programmed to have the third threshold voltage distribution, from among the memory cells, and changing the data state of the second latch according to a result of the check.

18. The method of claim 17, wherein checking whether there are memory cells programmed to have the third threshold voltage distribution, from among the memory cells, comprises:
precharging the sense node and changing a voltage level of the sense node by performing a data read operation using the third verification voltage;
changing the state of the data of the second latch according to the voltage level of the sense node;
precharging the sense node and changing a voltage level of the sense node by performing a data read operation using the fourth verification voltage; and
changing the state of the data of the second latch according to the voltage level of the sense node.

19. The method of claim 18, wherein verifying the memory cells to be programmed to have the second threshold voltage distribution comprises:
performing a program operation on the memory cells according to the states of the data of the first, second, and third latches;
performing a first verification by:
performing a read operation using the first verification voltage;

changing the voltage level of the sense node according to the data state of the first latch; and changing the data state of the third latch according to the voltage level of the sense node;

performing a second verification by:

performing a read operation using the second verification voltage;

changing the voltage level of the sense node according to the data state of the first latch; and changing the data state of the second latch according to the voltage level of the sense node; and determining whether the first and second verification operations are a pass based on a first verification signal generated according to the states of the data of the first and second latches.

20. The method of claim 19, wherein if, as a result of the determination, the first and second verification operations are determined to be a pass, the first and second verification operations are blinded.

21. The method of claim 19, wherein verifying the memory cells to be programmed to have the third threshold voltage distribution comprises:

performing a third verification by:

performing a read operation using the third verification voltage;

changing the voltage level of the sense node according to the state of the data of the second latch; and changing the state of the data of the third latch according to the voltage level of the sense node; and performing a fourth verification by:

performing a read operation using the fourth verification voltage; and changing the state of the data of the second latch according to the voltage level of the sense node.

22. The method of claim 21, wherein verifying the memory cells which will be programmed to have the fourth threshold voltage distribution comprises:

performing a fifth verification by:

performing a read operation using the fifth verification voltage; and changing the state of the data of the second latch according to the voltage level of the sense node; and determining whether the third, fourth, and fifth verification operations are a pass based on a second verification signal generated according to the states of the data of the second and third latches.

23. The method of claim 22, further comprising, if, as a result of the determinations, the first, second, third, fourth, and fifth verification operations are determined not to be a pass:

raising a program voltage;

performing the program operation using the raised program voltage; and performing the first, second, third, fourth, and fifth verifications.

* * * * *